United States Patent [19]

Parker et al.

[11] Patent Number: 5,081,069
[45] Date of Patent: Jan. 14, 1992

[54] METHOD FOR DEPOSITING A TIO₂ LAYER USING A PERIODIC AND SIMULTANEOUS TILTING AND ROTATING PLATFORM MOTION

[75] Inventors: Sidney G. Parker, Dallas; Jerry Wood, Lewisville; Robert T. Turner, Dallas; Craig A. Fischer, Plano, all of Tex.

[73] Assignee: Texas Instruments Incorporated, Dallas, Tex.

[21] Appl. No.: 457,113

[22] Filed: Dec. 26, 1989

[51] Int. Cl.⁵ .................. H01L 21/00; H01L 21/02; H01L 21/86; H01L 21/316
[52] U.S. Cl. .................. 437/235; 437/225; 437/228; 437/2; 118/715; 118/729; 118/730; 136/244; 136/250; 427/248.1
[58] Field of Search .................. 437/225, 228, 235, 2; 118/715, 729, 730, 731, 733; 427/38, 39, 50, 248.1; 136/244, 250

[56] References Cited

U.S. PATENT DOCUMENTS

| | | | |
|---|---|---|---|
| 3,998,659 | 12/1976 | Wakefield | 136/250 |
| 4,449,880 | 5/1984 | Hartman | 414/421 |
| 4,614,835 | 9/1986 | Carson et al. | 136/250 |
| 4,618,542 | 10/1986 | Morita et al. | 427/39 |
| 4,637,855 | 1/1987 | Witter et al. | 136/250 |
| 4,691,076 | 9/1987 | Levine et al. | 437/2 |
| 4,717,586 | 1/1988 | Ishihara et al. | 427/39 |

FOREIGN PATENT DOCUMENTS

| | | | |
|---|---|---|---|
| 0194531 | 10/1985 | Japan | 427/99 |
| 1194823 | 8/1986 | Japan | 427/39 |

OTHER PUBLICATIONS

Wolf, S. Silicon Processsing for the VLSI Era. vol. 1, Lattice Press, 1986, p. 164.
Fuyuki, T. "Effects of Small Amount of Water on Physical and Electrical Properties of TiO₂ Films Deposited by CVD Method," Electrochem. Soc., Sol. State Sci. and Tech. Jan 1988, pp. 248-250.

Primary Examiner—Brian E. Hearn
Assistant Examiner—B. Everhart
Attorney, Agent, or Firm—Melvin Sharp; James T. Comfort; N. Rhys Merrett

[57] ABSTRACT

Method and apparatus are disclosed for depositing a uniform layer of material, such as titanium dioxide, on the surface of an object, such as a silicon sphere of a solar array (7). Component gases are injected at predetermined rates into a heated reaction chamber (5) where they react. Because of the reaction rate and injection velocities of the gases, the reaction is substantially completed at a calculated location inside the reaction chamber (5). The object which is to receive the layer, such as the solar array (7), is placed at the calculated location in the reaction chamber (5). The platform (68) to which the solar array (7) is attached is simultaneously tilted and rotated such that all areas of the surface of the array (7) are uniformly exposed to the titanium dioxide reactant.

19 Claims, 2 Drawing Sheets

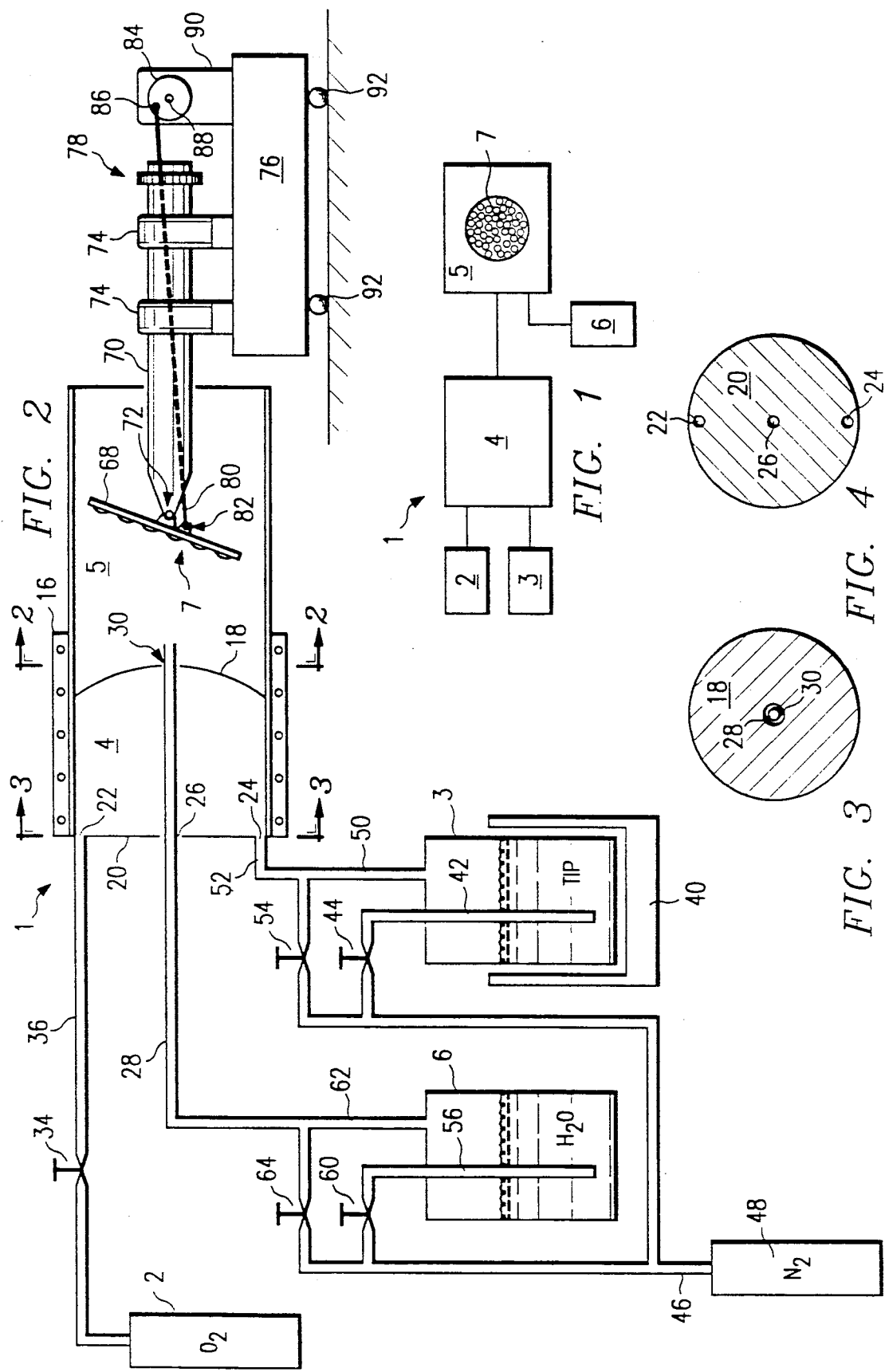

METHOD FOR DEPOSITING A TIO2 LAYER USING A PERIODIC AND SIMULTANEOUS TILTING AND ROTATING PLATFORM MOTION

RELATED APPLICATIONS

This application is related to co-pending applications U.S. Ser. No. 387,677, filed July 31, 1989; U.S. Ser. No. 387,250, filed July 31, 1989; Ser. No. 388,105, filed July 31, 1989; U.S. Ser. No. 388,280, filed July 31, 1989; U.S. Ser. No. 387,929, filed July 31, 1989; and U.S. Ser. No. 387,244, filed July 31, 1989, incorporated by reference herein.

TECHNICAL FIELD OF THE INVENTION

This invention relates in general to the deposition of a layer of material on the surface of an object, and more particularly to a method and apparatus for depositing a layer on a spherical object.

BACKGROUND OF THE INVENTION

In solar cell design, it is important that an anti-reflective layer be applied to the solar cell to increase its current output and efficiency. When the surface of the solar cell is flat, it is relatively easy to uniformly deposit a layer of anti-reflective material over a large surface area. Various techniques, such as spin-on of solutions, chemical vapor deposition (CVD) and sputter deposition, have been used to deposit a layer on flat surfaces.

Recently, solar cells have been built by incorporating a plurality of silicon spheres to form a solar array which efficiently produces electricity from the sun's radiation as described in U.S. Pat. No. 4,691,076 to Levine et al., incorporated by reference herein. During production of the array, each silicon sphere is embedded in aluminum foil such that only a hemispherical surface is exposed. Unfortunately, none of the prior layering techniques produced the desired thin, uniform layer on the hemispherical surfaces of the silicon spheres used in these new solar cells.

When performing the spin-on technique, a titanium containing solution is spun onto a flat surface to form a thin layer of titanium dioxide to serve as the anti-reflective layer. However, when depositing a layer on a curved surface using the spin-on technique uniform coverage and thickness on the hemispherical surfaces of the silicon cells is difficult to obtain.

During sputtering deposition, a titanium metal is sputtered onto the desired surface and then oxidized to form titanium dioxide. However, oxidation of the metal requires high temperatures which may damage or destroy the material of the solar array.

Depositing layers by CVD methods on spherical surfaces also does not result in uniform thickness and coverage when applied to irregular or curved surfaces, such as the hemispherical surfaces of the spherical solar cells. Such deposition is anisotropic such that only those areas of the solar cell surface which are approximately perpendicular to the flow of the reacting chemicals obtain an adequate layer. Other areas of the surface, such as those on the sides of the silicon spheres, are approximately parallel to the flow of the reacting chemicals and obtain an inadequate deposit.

Therefore, a need has arisen to provide an apparatus and method for depositing a uniform layer of a titanium dioxide compound onto silicon spheres used in solar cells.

SUMMARY OF THE INVENTION

In accordance with the present invention, an apparatus and method are provided which substantially eliminate the disadvantages and problems associated with prior methods of depositing a layer of material, such as titanium dioxide, on the surface of spherical objects.

In one aspect of the invention, a mixing chamber is provided to allow a first set of gases to mix, such as titanium isoproxide (TIP) vapor and oxygen. The mixture of the first gases is injected into a reaction chamber as is a second gas, such as water vapor. The object on which the location inside the reaction chamber such that the reaction producing the layer substantially occurs on the surface of the object.

In another aspect of the present invention, the object in the reaction chamber is attached to a platform which is simultaneously and periodically tilted and rotated. Thus, all portions of the surface of the object are exposed equally to the reacting chemicals. In this fashion, the surface of an irregular or spherical object, as well as of a flat object, can be provided with a uniform layer of material.

Hence, the apparatus and method of the present invention provide the technical advantage of depositing a uniform layer of material on the surface of an object, including, but not limited to, surfaces which are spherical.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 illustrates a block diagram of the present invention;

FIG. 2 illustrates a detailed schematic representation of the present invention;

FIG. 3 illustrates a sectional view of the barrier wall between the mixing and reaction chambers on the line II—II in FIG. 2;

FIG. 4 illustrates a sectional view of the end wall of the mixing chamber on the line III—III in FIG. 2;

DETAILED DESCRIPTION OF THE INVENTION

Figure 5:
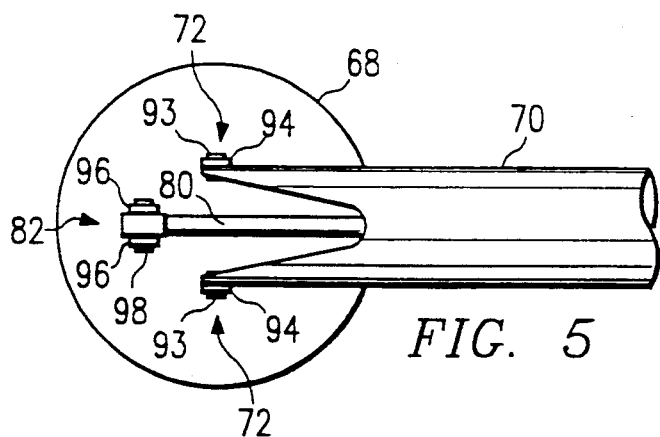
FIG. 5 illustrates a detailed view of the solar array platform held by the rotation tube and push rod.

The preferred embodiment of the present invention is best understood by referring to FIGS. 1-7 of the drawings, like numerals being used for like and corresponding parts of the various drawings.

FIG. 1 illustrates a block diagram of the apparatus of the present invention, indicated generally as 1. Two gas sources 2 and 3 are coupled to a mixing chamber 4. Mixing chamber 4 is coupled to a reaction chamber 5. A gas source 6 is also coupled to reaction chamber 5. A solar array 7, or other surface to be coated with a layer of material, is placed inside reaction chamber 5.

In operation, gas sources 2 and 3 inject two gases into mixing chamber 4 where the gases mix to form a third gas which is injected into reaction chamber 5. Gas source 6 injects a fourth gas into reaction chamber 5 in the same direction as the third gas is injected. The third and fourth gases do not react instantaneously, but rather react at a known rate. Because of the injection velocities of the gases, the reaction is substantially completed at a location within reaction chamber 5 a calculated distance from the points at which the gases are injected. Solar array 7 is positioned in reaction chamber 5 at the calculated location such that the reaction is substantially completed at the surface of solar array 7. Solar array 7 is simultaneously tilted and rotated within reaction chamber 5 thereby exposing all areas of the surface of solar array 7 to the reacting gases. Consequently, the reactant, an antireflective material, is deposited in a uniform layer on the surface of solar array 7.

In one aspect of the present invention, the first and second gases are oxygen and titanium isoproxide vapor, respectively, and the third gas is a mixture of the two. The fourth gas is water vapor and the antireflective reactant is titanium dioxide.

FIG. 2 shows more detailed a schematic representation of the apparatus of the present invention Mixing chamber 4 and reaction chamber 5 are placed end-to-end in a furnace 16 and are separated by a barrier wall 18. An end wall 20 of mixing chamber 4 seals mixing chamber 4 from the outside environment. Two holes 22 and 24 formed in end wall 20 serve as input ports to mixing chamber 4. An additional hole 26 formed in end wall 20, permits an inlet line 28 to pass through mixing chamber 4 and into reaction chamber 5. An injection port 30 formed in barrier wall 18 between the two chambers 4 and 5 allows the chemical mixture formed in mixing chamber 4 to pass into reaction chamber 5. In addition, inlet line 28 passes through injection port 30 into reaction chamber 5.

Oxygen is supplied by gas source 2 through a valve 34 coupled to a tube 36. Tube 36 terminates at input port 22 in end wall 20 of mixing chamber 4.

A titanium isoproxide (TIP) solution is held in a gas source 3 to be heated by a heater 40. One end of tube 42 is submerged in the TIP solution; the other end of tube 42 is connected to a valve 44 which is coupled to another tube 46 which terminates at nitrogen gas tank 48. One end of another tube 50 is situated above the TIP solution. The other end of tube 50 is coupled to tube 52 which terminates at input port 24 in end wall 20 of mixing chamber 4. Tube 52 is also coupled to nitrogen tube 46 through valve 54.

Similarly, a tube 56 is submerged in deionized water held in a gas source 6. Tube 56 is coupled to nitrogen tube 46 through valve 60. One end of another tube 62 is situated above the surface of the water. The other end of tube 62 is coupled to inlet line 28 which terminates in reaction chamber 5. Inlet line 28 is also coupled to nitrogen tube 46 through valve 64.

Solar array 7 is clipped onto one side of platform 68. Platform 68 is coupled on the other side to rotation tube 70 with two pivots 72. Rotation tube 70 is held in place by bearing units 74 attached to base 76. A cog-belt drive, indicated generally at 78, is placed circumferentially around rotation tube 70 and is coupled to a motor (not shown).

Push rod 80 is also coupled to platform 68 with pivot 82. Push rod 80 is situated inside rotation tube 70 and the end opposite platform 68 is coupled to cam 84 with ball joint 86. Cam 84 is coupled to a shaft 88 of motor 90 which is attached to base 76.

A set of wheels 92 attached to base 76 allow platform 68 and solar array 7 to be easily pushed into and pulled out of reaction chamber 5.

FIG. 3 illustrates a view of barrier wall 18 between mixing chamber 4 and reaction chamber 5. Opening 30 is shown in the center of barrier wall 18 with tube 28 passing through opening 30.

FIG. 4 illustrates a view of end wall 20 of mixing chamber 4 and shows the locations of injection ports 22 and 24 and opening 26 through which inlet line 28 passes.

FIG. 5 illustrates the details of the pivots connecting platform 68 with rotation tube 70 and push rod 80. Solar array 7 is clipped to the side of platform 68 opposite the side shown in FIG. 5. Opposite sides of the end of rotation tube 70 have been cut away as indicated and pins 93 are inserted through attachment plates 94 and through holes (not shown) formed in the end of rotation tube 70. A similar pivot 82 provides the attachment for push rod 80 to platform 68. Push rod 80 is placed between two attachment plates 96 and pin 98 is inserted through holes formed in attachment plates 96 and push rod 80. Pivot 82 is located a predetermined distance from an imaginary line connecting pivot points 72.

Figure 6:
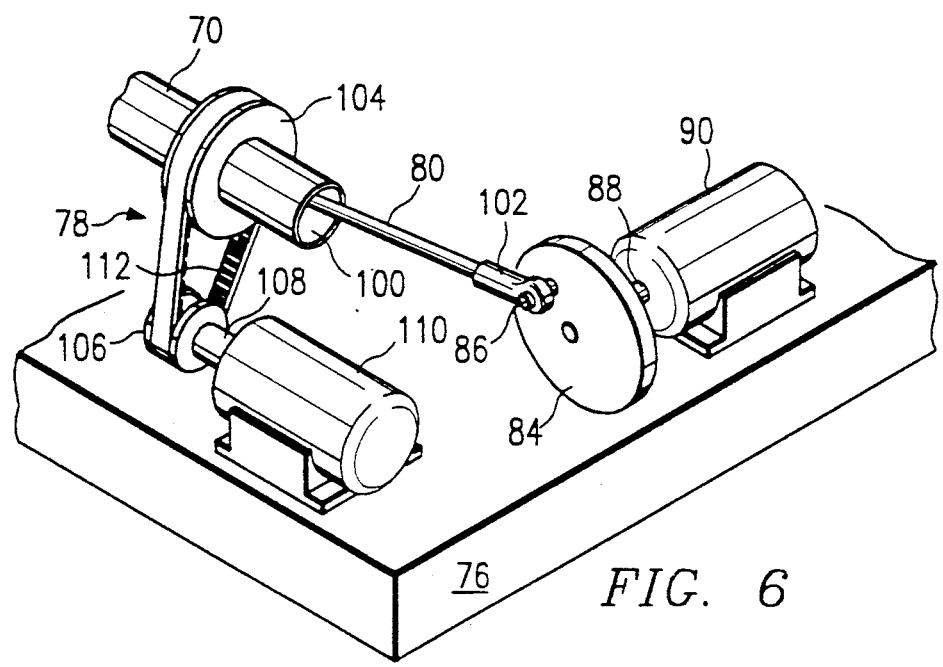
FIG. 6 illustrates a detailed view of the drive mechanisms for tilting and rotating the platform.

FIG. 6 illustrates the details of the opposite end of rotation tube 70 showing the drive mechanisms. The end of rotation tube 70 not connected to platform 68 is closed by a cap 100 in the center of which has been drilled a hole. Push rod 80, located inside of rotation tube 70, extends out through the hole in end cap 100. Coupling 102 has a sleeve on one end into which the end of push rod 80 is inserted and fixed. The other end of coupling 102 encircles ball joint 86 in such way that ball joint 86 can freely rotate. Ball joint 86 is attached to one side of cam 84 a predetermined distance from the point at which cam 84 is attached to shaft 88 of drive motor 90.

Toothed sprocket wheel 104 is secured around the circumference of rotation tube 70. A similar, but smaller, toothed sprocket wheel 106 is secured to a shaft 08 of rotation drive motor 110. A cog belt 112 engages the sprockets of sprocket wheels 104 and 106 to transfer the rotational motion from rotation drive motor 110 to rotation tube 70. In one aspect of the present invention, small sprocket wheel 106 may be coupled to drive motor 110 through a set of reduction gears and cam 4 may be coupled to drive motor 90 through a separate set of reduction gears. Both drive motors 90 and 110 are mounted on base 76.

Figure 7:
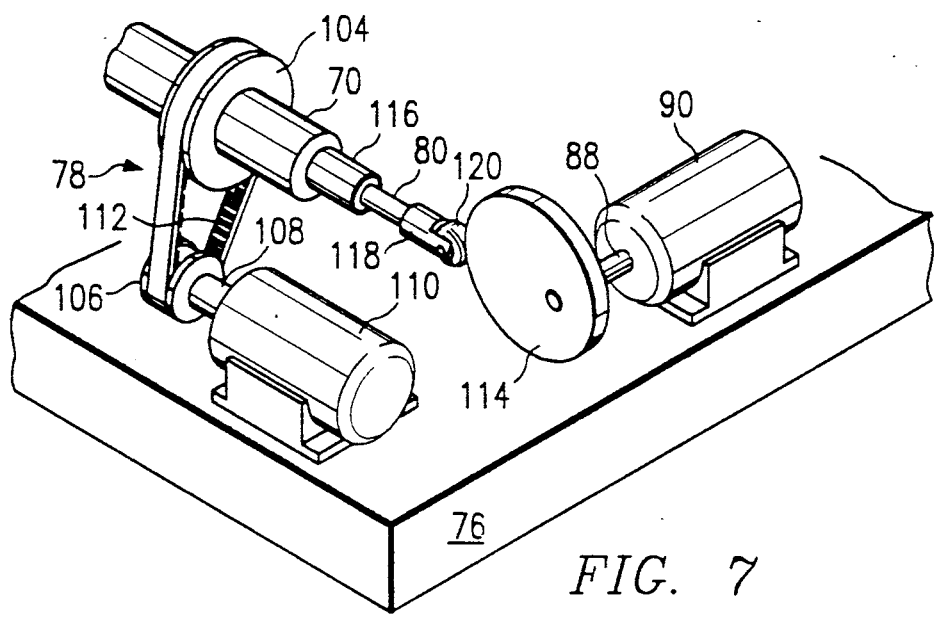
FIG. 7 illustrates an alternative embodiment of the drive mechanisms.

FIG. 7 illustrates an alternative embodiment for push rod 80 drive mechanism. As before, drive motor 90 is mounted on base 76. A cam 114 is attached off-centered to motor shaft 88. Extending from the end of rotation tube 70 is a housing 116 through which push rod 80 extends. A coupling 118 contains a sleeve at one end through which push rod 80 is inserted and fixed. The opposite end of coupling 118 contains an axle on which a cam follower 120 is mounted. A spring mechanism (not shown) inside housing 116 biases cam follower 120 to maintain contact with cam 114 at all times.

Alternative means for driving rotation tube 70 and push rod 80 are possible without deviating from the scope of this description or the claims.

Referring again to FIG. 2, in operation, the TIP solution is heated in gas source 3 by heater 40. Nitrogen from nitrogen tank 48 flows through tube 42 and bubbles through the TIP solution to pick up TIP vapors. Valve 44 controls the rate at which the nitrogen bubbles through the TIP solution. Simultaneously, nitrogen controlled by valve 54 sweeps the TIP vapors through tube 50 and into tube 52 to be injected into mixing chamber 4 through injection port 24.

In a similar manner, deionized water in gas source 6 is swept by nitrogen gas into inlet line 28 and injected into reaction chamber 5.

Oxygen from gas source 2 flows through tube 36 directly into mixing chamber 4 through input port 22.

The TIP is injected through input port 24 at a rate determined by the setting of nitrogen sweep valve 54. The rate at which oxygen is injected into mixing chamber 4 through input port 22 is determined by the setting of valve 34. The rate at which water vapor is injected into reaction chamber 5 is determined by the setting of valve 64.

The TIP and the oxygen are mixed in mixing chamber 4 and are injected through injection port 30 into reaction chamber 5. The rate at which the TIP and oxygen enter mixing chamber 4 through input ports 24 and 22, respectively, determines the rate at which the mixture of the two substances enters reaction chamber 5 through injection port 30.

Once inside reaction chamber 5, the TIP and water react to form titanium dioxide as follows:

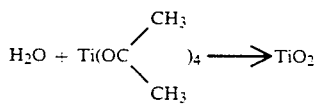

In another embodiment, a straight chained proxide can be used to carry the titanium. However, reaction temperatures would be required which are higher than the temperatures required by the preferred embodiment.

The reaction in which the titanium dioxide is produced occurs at a known rate. Because the TIP/oxygen mixture and the water vapor are injected into reaction chamber 5 with a known velocity, the reaction rate can be translated into a distance such that the reaction is substantially completed a certain distance from injection port 30. To obtain a proper layer of titanium dioxide on solar array 7, solar array 7 must be placed at the location in reaction chamber 5 where the chemical reaction is substantially completed. Knowing the reaction rate and the velocities with which the TIP/oxygen mixture and water vapor are injected into reaction chamber 5, the optimum distance of array 7 from injection port 30 can be calculated.

In order for all areas of the exposed spherical surfaces of solar array 7 to be uniformly covered with the titanium dioxide layer, array 7 must be simultaneously rotated and tilted, thereby presenting all sides of each hemisphere to the reacting chemicals.

Rotation drive motor 110 is electrically connected to a variable speed control (not shown) which is adjusted for the desired rotation speed. Rotation drive motor 110 causes small sprocket wheel 106 to turn. Small sprocket wheel 106 drives cog belt 112 which, in turn, drives large sprocket wheel 104 causing rotation tube 70 and platform 68 to rotate.

Simultaneously, push rod drive motor 90, which is also electrically coupled to a variable speed control (not shown) causes cam 84 to rotate. Ball joint 86, which is fixed to cam 84, revolves about the point at which shaft 88 is attached to cam 84. Ball joint 86 also rotates within the enclosure at one end of coupling 102, thereby translating the rotational motion of drive motor 90 into a reciprocal linear motion for push rod 80.

As push rod 80 reciprocates through rotation tube 70, it alternately pushes and pulls on platform 68 at pivot 82. Platform 68, in turn, oscillates through a prescribed arc on pivots 72. The arc through which platform 68 oscillates is determined by two factors: (1) the shortest distance between the pivot 82 and an imaginary line between the two pivots 72; and (2) the distance between ball joint 86 on cam 84 and the point on cam 84 at which shaft 88 is attached.

In the alternative embodiment of the push rod 80 drive mechanism shown in FIG. 7, drive motor 90 causes cam 114 to revolve in an eccentric fashion about the point at which shaft 88 is attached. As mentioned, the spring mechanism inside housing 116 biases cam follower 120 against cam 114. Consequently, as cam 114 rotates, the eccentric motion of cam 114 is translated into a reciprocal lateral motion of push rod 80. The rotation tube drive mechanism remains the same as depicted in FIG. 6.

EXAMPLE

Tests have been made with device 1 to deposit a layer of titanium dioxide on spherical solar cells in an array. The parameters which result in a uniform deposition are now described.

The TIP is heated to approximately 100° C., the deionized water is maintained at room temperature (approximately 25° C.) and the reaction chamber is heated by the furnace to between approximately 200° C. and approximately 300° C.

The oxygen is injected into the mixing chamber at the rate of approximately 3,000 cc/min. The nitrogen is bubbled through the TIP solution at a the rate of approximately 200 cc/min. The nitrogen sweep of the TIP vapors into the mixing chamber occurs at the rate of approximately 2,000 cc/min.

The nitrogen is bubbled through the deionized water at the rate of approximately 20 cc/min. and the nitrogen sweep of the water vapors into the reaction chamber is approximately 1,000 cc/min.

In the prototype tested, the mixing chamber and reaction chamber are each 2½ inches in diameter and the distance between the solar array and the injection port in the reaction chamber averages 5½ inches. The injection port in the center of the barrier wall between the mixing and reaction chambers (through which the TIP/oxygen mixture is propelled) is ½ inch. The inlet line through which the water vapor is injected into the reaction chamber has an inside diameter of 6 mm.

The rotation tube is rotated at the rate of four revolutions per minute and the platform on which the array is clipped tilts at the rate of four oscillations per minute. The solar array has a total area of approximately ten cubic centimeters and comprises spherical solar cells, each with a diameter of 17.5 mils. The solar cells are mounted in aluminum foil on 19 mil centers; only hemispherical surfaces are exposed for coating.

Given these parameters, titanium dioxide is deposited on the solar cells at the rate of approximately 150 angstroms per minute until the layer attains a desired thickness of between approximately 700 and approximately 800 angstroms. After the deposition has been completed, the array is removed from the platform and sintered at approximately 400° C. to complete the process.

The resulting layer creates an anti-reflective coating on the solar cells having a density of approximately 2.54 and refractive index of approximately 2.4. This compares with a refractive index of less than approximately 2.1 for prior art CVD methods which indicates that less light incident upon the solar cells will be reflected and more light will be absorbed and converted into electrical current.

Thus, the apparatus and method of the present invention have the technical advantage of providing uniform deposition of titanium dioxide on spherical solar cells at far lower temperatures than are required by the prior art. In the tests, the resulting anti-reflective layer has increased the short-circuit current of the solar cells by between 20%-30%.

Layers of titanium dioxide can also be deposited on irregular and flat surfaces using the apparatus and method described and claimed herein. Furthermore, layers of other metal oxides can be deposited using the apparatus and method of the present invention.

Although the present invention has been described in detail, it should be understood that various changes, substitutions and alterations can be made herein without departing from the spirit and scope of the invention as defined by the appended claims.

What is claimed is:

1. A method for depositing a layer of material on the surface of an object, comprising the steps of:
   removably holding the object on a platform;
   placing said platform at a predetermined location within said reaction chamber;
   imparting a rotating motion to a rotation tube coupled to said platform;
   imparting a periodic, reciprocal linear motion to a push rod coupled to said platform such that the platform periodically and simultaneously tilts and rotates whereby all areas of the surface of the object are uniformly exposed to the reacting gases;
   injecting a first gas into a reaction chamber at a predetermined rate; and
   injecting a second gas into said reaction chamber at a predetermined rate to react with said first gas at a predetermined location within said reaction chamber.

2. The method of claim 1 and further comprising the step of mixing a third and a fourth gas to generate said second gas.

3. The method of claim 1 wherein said first gas is water vapor.

4. The method of claim 1 wherein said second gas is titanium isoproxide and oxygen.

5. The method of claim 2 wherein said third gas is titanium isoproxide.

6. The method of claim 2 wherein said fourth gas is oxygen.

7. The method of claim 1 wherein said step of imparting a rotating motion to said rotation tube comprises the step of driving said rotation tube with a motor.

8. The method of claim 1 wherein said step of imparting a reciprocating linear motion to said push rod comprises the step of driving a cam coupled to said push rod with a motor.

9. A method for depositing a layer of material on the surface of an object, comprising the steps of:
   injecting a first gas into a reaction chamber at a predetermined rate;
   injecting a second gas into said reaction chamber at a predetermined rate to react with said first gas at a predetermined location within said reaction chamber;
   mixing a third and a fourth gas to generate said second gas;
   removably holding the object on a platform;
   placing said platform at a predetermined location within said reaction chamber;
   imparting a rotating motion to a rotation tube coupled to said platform; and
   imparting a periodic, reciprocal linear motion to a push rod coupled to said platform such that the platform periodically and simultaneously tilts and rotates whereby all areas of the surface of the object are uniformly exposed to the reacting gases.

10. The method of claim 9 wherein said step of imparting a rotating motion to said rotation tube comprises the step of driving said rotation tube with a motor.

11. The method of claim 9 wherein said step of imparting a reciprocating linear motion to said push rod comprises the step of driving a cam coupled to said push rod with a motor.

12. The method of claim 9 wherein said first gas is water vapor.

13. The method of claim 9 wherein said second gas is titanium isoproxide.

14. The method of claim 9 wherein said third gas is titanium isoproxide.

15. The method of claim 9 wherein said third gas is oxygen.

16. A method for depositing a uniform layer of titanium dioxide on the surface of a solar cell array, comprising the steps of:
   heating a solution of titanium isoproxide to produce titanium isoproxide vapors;
   bubbling nitrogen gas through said titanium isoproxide solution to pick u said titanium isoproxide vapors;
   sweeping said titanium isoproxide vapors into a mixing chamber with nitrogen gas;
   injecting oxygen gas into said mixing chamber to mix with said titanium isoproxide vapors;
   injecting the mixture of titanium isoproxide vapors and oxygen into a reaction chamber;
   bubbling nitrogen gas through deionized water to produce water vapor;
   sweeping and injecting said water vapor into said reaction chamber;
   heating said reaction chamber;
   producing a reactant of titanium dioxide;
   simultaneously and periodically tilting and rotating the solar cell in said reaction chamber; and
   depositing said reactant on the solar cell array.

17. The method of claim 16 wherein said tilting and rotating step comprises the steps of:
   removably attaching the solar cell array to a platform;
   imparting a rotating motion to a rotation tube coupled to said platform; and
   imparting a periodic, reciprocal linear motion to a push rod coupled to said platform such that the platform periodically and simultaneously tilts and rotates whereby all areas of the surface of the solar cell array are uniformly exposed to the titanium dioxide reactant.

18. The method of claim 16 wherein said titanium proxide is heated to between 85° C. and 110° C.

19. The method of claim 16 wherein said reaction chamber is heated to between 200° C. and 300° C.

* * * * *